United States Patent [19]

McAllister

[11] Patent Number: 5,150,786
[45] Date of Patent: Sep. 29, 1992

[54] THERMOPLASTIC TUBULAR CONTAINER FOR SEMICONDUCTOR DEVICES WITH LONGITUDINAL OPENING MEANS

[75] Inventor: Michael J. McAllister, Irving, Tex.

[73] Assignee: Advanced Dynamics Corporation, Arlington, Tex.

[21] Appl. No.: 815,386

[22] Filed: Dec. 31, 1991

[51] Int. Cl.[5] ........................ B65D 73/02; B65D 43/18
[52] U.S. Cl. .................... 206/328; 206/334; 220/281; 361/212; 361/220
[58] Field of Search ............... 220/682, 691, 281, 285; 206/328, 331, 334; 361/212, 220

[56] References Cited

U.S. PATENT DOCUMENTS

| | | | |
|---|---|---|---|
| 496,610 | 5/1893 | Hurlbut | 220/281 |
| 3,737,031 | 6/1973 | Carroll | 206/328 X |
| 4,463,851 | 8/1984 | Cecil | |
| 4,635,794 | 1/1987 | Lemmer | 206/328 |
| 4,702,371 | 10/1987 | Hoshi et al. | |
| 4,752,005 | 6/1988 | Hofmann et al. | 206/334 |
| 4,767,004 | 8/1988 | Ishihara et al. | 206/334 |
| 4,842,135 | 6/1989 | Borst et al. | 206/328 |
| 4,844,258 | 7/1989 | Boeckmann et al. | 206/328 |
| 4,865,197 | 9/1989 | Craig | 206/328 |

FOREIGN PATENT DOCUMENTS

| | | | |
|---|---|---|---|
| 2601339 | 1/1988 | France | 206/328 |
| 294383 | 12/1988 | Japan | |
| 1593760 | 7/1981 | United Kingdom | |

OTHER PUBLICATIONS

Thielex Plastics Corporation Advertisement Mar. 1987.
"Guard Against ESD Damage", Dande Plastics Advertisement Oct. 1985.
"Guard Against ESD Damage", Dande Plastics Advertisement Apr. 1984.

*Primary Examiner*—Bryon P. Gehman
*Attorney, Agent, or Firm*—Laubscher & Laubscher

[57] ABSTRACT

A packaging container made of static dissipative or electrically conductive thermoplastic is used to retain and protect semiconductor devices susceptible to physical damage caused by static electricity. The container is formed as a tube and may take a variety of cross-sectional profiles and lengths. The tubular container has one divided wall comprised of two longitudinally opposed portions which may be separated forming a partial longitudinal opening in the wall. This opening permits the in-container visual identification of the semiconductor devices and their respective positions within the enclosure. The tubular container may be formed from a single thermoplastic material which may be opaque and is readily recyclable.

6 Claims, 1 Drawing Sheet

THERMOPLASTIC TUBULAR CONTAINER FOR SEMICONDUCTOR DEVICES WITH LONGITUDINAL OPENING MEANS

BACKGROUND OF THE INVENTION

As semiconductor devices evolved throughout the 1970's, they were designed with greater circuit density and thus, became more sensitive to static electricity. The more sensitive semiconductor devices were discovered to be highly susceptible to an otherwise invisible phenomenon; electrostatic discharge (ESD). At that time little was understood about the nature of the threat that ESD held for semiconductor devices.

The rapid discharge of high voltage static charges was found to cause irreparable physical damage to the increasingly minuscule circuitry of the newer generation semiconductor devices. To protect the semiconductor devices from ESD as they are handled, shipped and stored, packaging containers were redesigned.

BRIEF DESCRIPTION OF THE PRIOR ART

The elongated tubular container, derived from one or more thermoplastic compounds, has achieved widespread, commercial acceptance. Available in various cross-sectional profiles, the tubular container allows the semiconductor devices to be stacked in a single columnar alignment within the tube's protective enclosure. When loaded with semiconductor devices, the tubular container is used to safely ship or store its contents until it is employed as a kind of magazine, dispensing the semiconductor devices to automatic assembly equipment. This application has caused the tubular container to become integrated into the automated production of finished printed circuit boards for computers and other electronic equipment.

Initially, packaging engineers specified ordinary insulative thermoplastic in the manufacture of the tubular containers so that transparency could be incorporated into their design. As in-container visual identification of the semiconductor devices and their respective positions within the packaging enclosure is extremely important, transparent thermoplastic materials appeared to be an attractive option. However, ordinary insulative thermoplastic inherently causes static charges to accumulate. Because this build-up of static charges will eventually cause an electrostatic discharge, the use of packaging made of ordinary insulative thermoplastic compound for sensitive semiconductor devices has been curtailed, unless the packaging is dip-coated with a static dissipative topical coating.

To avoid the additional expense and production time involved with topically coating the tubular containers, newer thermoplastic compounds used in the manufacture of tubular containers either include a static dissipative or electrically conductive additive in their formulations to significantly diminish the accumulation of static charges. However, this is done at the expense of transparency. Presently, the more cost-effective static dissipative and electrically conductive additives (e.g., migratory hygroscopics, carbon black, graphite, metallic flake or fiber, etc.) when added to a thermoplastic compound to render it and the resultant extruded tubular container static dissipative or electrically conductive, cause the tubular container to lose transparency and often, make the tubular container opaque.

One solution suggests the use of an ordinary, insulative transparent thermoplastic to form a clear coextruded or laminated window into the otherwise non-transparent packaging enclosure as disclosed in the Cecil U.S. Pat. No. 4,463,851. To help prevent the accumulation of static charges, particularly on the ordinary, insulative transparent thermoplastic portion, the tubular container is treated by dip-coating it with a topical, transparent, static dissipative coating. These volatile surface coatings are not permanent and coverage is sometimes incomplete. Thus, the transparent portion of the tubular container is considered the weak link in the design of a packaging enclosure intended to provide optimum ESD protection. These two-material coextrusions and laminations effectively preclude the feasibility of recycling the thermoplastic materials used in containers and in recent years, certain varieties of these coatings have also been shown to cause corrosion in some metallic leads of the semiconductor devices.

The present invention was developed in order to provide highly sensitive semiconductor devices with optimum protection from ESD during shipping and handling. At present, the semiconductor industry is seeking this magnitude of protection in a coextruded or laminated tubular container, where an ordinary, insulative transparent thermoplastic portion is bonded with a larger electrically conductive thermoplastic portion. However, a growing constituency within the semiconductor industry is becoming dissatisfied with the reliability of the coextruded or laminated tubular container. The present invention provides a packaging enclosure which does not include the transparent portion and thus overcomes many of the drawbacks of conventional containers.

SUMMARY OF THE INVENTION

Accordingly, it is a primary object of the invention to provide a packaging container for the protection of semiconductor devices including an elongated tubular housing defining a chamber within which a plurality of semiconductor devices are arranged. The housing is formed of static dissipative or electrically conductive thermoplastic material for shielding the semiconductor devices from static electricity. The housing includes a first wall containing a longitudinal slit defining separable wall portions movable between an open position where the wall portions are spaced from one another and a closed position where the wall portions are in contiguous relation. The housing further includes a second wall opposite the first wall and including a flexible portion normally biasing the first wall portions to the closed position. With the first wall closed, the semiconductor devices are protected from static electricity. The semiconductor devices can be visually inspected when the first wall portions are separated to the open position.

BRIEF DESCRIPTION OF THE FIGURES

Other objects and advantages of the invention will become apparent from a study of the following specification when viewed in the light of the accompanying drawing, in which.

DETAILED DESCRIPTION

Figure 1:
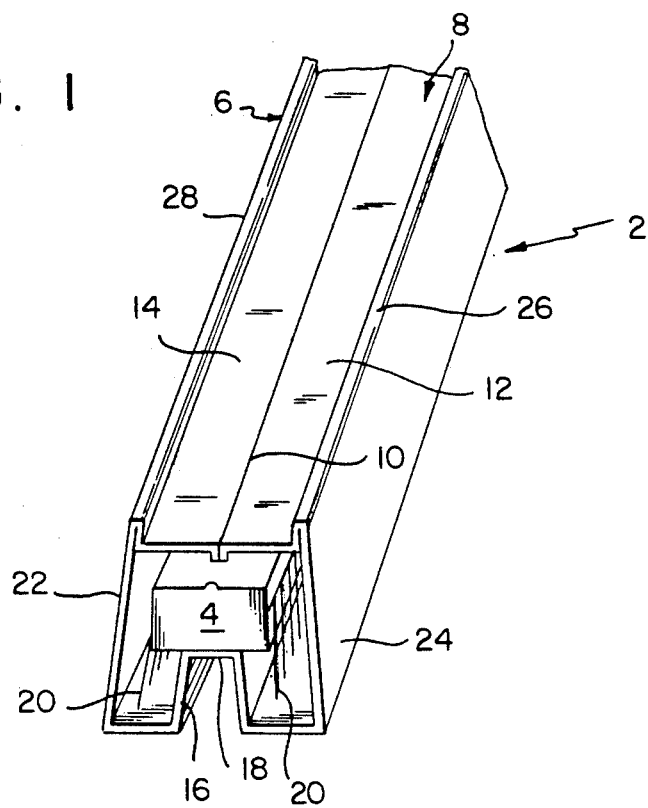
FIG. 1 is a partial perspective view of the thermoplastic packaging container of the invention in its closed position.

Referring to the drawing, the present invention relates to a packaging container 2 for a plurality of semiconductor devices 4. The packaging container is formed of a single thermoplastic material which is effective to shield the semiconductor devices from static electricity. One suitable thermoplastic material is electrically conductive material such as CONDUX 9000 manufactured by Advanced Dynamics Corporation. A second suitable material is static dissipative thermoplastic material.

Figure 2:
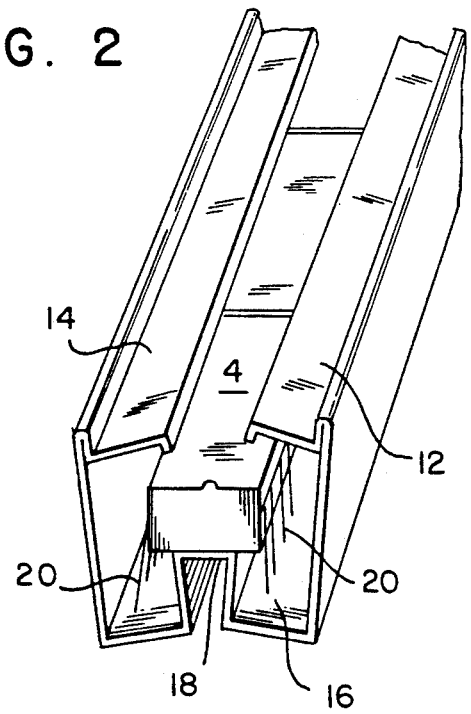
FIG. 2 is a partial perspective view of the container of FIG. 1 in its open position.

As shown in FIG. 1, the container 2 is formed as an elongated tubular housing 6 defining a chamber within which the semiconductor devices are retained. The housing 6 includes a first wall 8 containing a longitudinal slit 10 extending continuously between the ends of the wall to define a pair of separable first wall portions 12, 14 which are movable between a closed position shown in FIG. 1 where the wall portions are in contiguous engagement and an open position shown in FIG. 2 where the wall portions are spaced from each other. In the closed position of FIG. 1, the packaging container 2 shields the semiconductor devices 4 from static electricity. A suitable end cover (not shown) may be provided to completely enclose the semiconductor devices. In the open position of FIG. 2, the semiconductor devices can be visually inspected.

A second wall 16 of the housing is arranged opposite the first wall 8 and contains a recessed flexible portion 18 which normally biases the first wall portions 12, 14 toward the closed position. The recessed flexible portion also functions as a saddle for supporting the semiconductor devices, with the fragile metallic leads 20 of the devices being suspended within the container on both sides of the recessed portion 18. Although the housing can have any suitable configuration depending on the devices being retained, a trapezoidal cross-section configuration is preferred as shown in the drawing. The first top wall 8 is thus narrower than the second bottom wall 16, with the side walls 22, 24 being tapered. This configuration affords protection to the semiconductor devices, and particularly to the leads 20 thereof. Furthermore, the integral recessed flexible saddle of the second wall 16 allows the semiconductor devices 4 to easily slide in and out of the housing in proper alignment.

Extending upwardly from each first wall portion 12, 14 is an integral longitudinal rib 26, 28. The ribs provide a gripping surface by which the first wall portions can be pulled or pried apart to the open position of FIG. 2 to enable visual identification of the enclosed semiconductor devices. As the first wall portions are separated, the flexible recessed portion 18 of the second wall 16 is flexed creating additional space about the metallic leads 20, thereby to prevent damage to the leads during inspection.

Upon the release of pressure applied to the protruding external ribs 26, 28 of the housing, the second wall 16 relaxes to its original form and there is no significant separation of the two portions of the first wall 8 and the tubular housing assumes the closed position. It is in this position that the tubular housing achieves its highest degree of protection of the semiconductor devices 4 where they are fully enclosed within the container. The design of the container obviates the need for a transparent window which may be a likely site for the accumulation of static charges. As the typical cost-effective ordinary transparent material used is electrically insulative, i.e. neither conductive nor dissipative, it requires the topical dip-coating described above. The coatings and the process add additional expense and can cause secondary production problems. Recently, many of the more popular coating additives have been found to introduce corrosion problems to the metallic leads of the semiconductor devices. All of these costs are eliminated by the novel design of the present invention.

Once each tubular container 2 is determined to have completed its life cycle, it is discarded. The coextruded or laminated designs of the containers widely used today are not bio-degradable and do not permit the cost-effective recovery and re-use of the thermoplastics materials they use. This presents a significant impediment to recyclability. The two thermoplastic materials used in coextruded or laminated tubular containers cannot be easily or adequately separated.

Any attempt to recycle the containers without separating the two distinctly different thermoplastic materials yields a single mixed raw material that is unfit for recycling without further treatment and handling. The mixed raw material is essentially contaminated by the ordinary, insulative transparent thermoplastic material and therefore, any electrically conductive property is lost. Due to the single-material design of the present invention, recycling of the elongated tubular container 2 is both supported and encouraged. No ordinary, insulative transparent thermoplastic is necessary to allow the in-container visual identification of the semiconductor devices 4 and their respective positions within the enclosure. Therefore, the static dissipative or electrically conductive properties of the single-material employed in the present invention will not be sacrificed during recovery and the thermoplastic material can be readily recycled. The ecological benefits of the present invention represent further significant advantages over the existing art.

A preferred embodiment is a tubular container 2 which comprises a novel design that: (1) does not require expensive coextrusion or lamination and therefore, utilizes a single static dissipative or electrically conductive thermoplastic compound; (2) eliminates ordinary, insulative transparent thermoplastic from critical ESD sensitive applications; (3) permits the critical in-container visual identification of the semiconductor devices and their respective positions within the packaging enclosure; and (4) obviates the need for any static dissipative migratory coating or secondary topical dip-coating production expense.

While in accordance with the provisions of the patent statute and the preferred forms and embodiments have been illustrated and described, it will be apparent to those of ordinary skill in the art that various changes and modifications may be made without deviating from the inventive concepts set forth above.

What is claimed is:

1. A packaging container for semiconductor devices, comprising
   (a) an elongated tubular housing defining a chamber within which a plurality of semiconductor devices are arranged, said housing being formed of thermoplastic material for shielding the semiconductor devices from static electricity; and
   (b) opening means for opening said housing to permit visual inspection of the semiconductor devices within said housing chamber, said opening means including (1) a first housing wall containing a longitudinal slit extending continuously between the ends thereof to define separable first wall portions movable between an open position where said wall portions are spaced from one another and a closed position where said wall portions are in contiguous relation; and (2) a second housing wall arranged opposite said first housing wall and including a flexible portion normally biasing said first wall portions to the closed position.

2. A packaging container as defined in claim 1, wherein said first wall portions include longitudinal ribs, respectively, for displacing said first wall portions to the open position.

3. A packaging container as defined in claim 2, wherein said second housing wall flexible portion is recessed to define a saddle for supporting the semiconductor devices, the leads of the semiconductor devices being arranged on opposite sides of the saddle.

4. A packaging container as defined in claim 3, wherein said housing has a generally trapezoidal cross-sectional configuration.

5. A packaging container as defined in claim 3, wherein said housing is formed from a single static dissipative thermoplastic material.

6. A packaging container as defined in claim 3, wherein said housing is formed from a single electrically conductive thermoplastic material.

* * * * *